(12) United States Patent
Tai et al.

(10) Patent No.: US 8,319,301 B2
(45) Date of Patent: Nov. 27, 2012

(54) SELF-ALIGNED FILTER FOR AN IMAGE SENSOR

(75) Inventors: Hsin-Chih Tai, Cupertino, CA (US); Duli Mao, Sunnyvale, CA (US); Vincent Venezia, Sunnyvale, CA (US); WeiDong Qian, Los Gatos, CA (US); Ashish Shah, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 412 days.

(21) Appl. No.: 12/029,392

(22) Filed: Feb. 11, 2008

(65) Prior Publication Data
US 2009/0200622 A1 Aug. 13, 2009

(51) Int. Cl.
*H01L 31/0232* (2006.01)
(52) U.S. Cl. ............... 257/432; 257/E31.054; 438/7
(58) Field of Classification Search ............ 257/432, 257/E31.045; 438/7
See application file for complete search history.

(56) References Cited

U.S. PATENT DOCUMENTS

| | | | |
|---|---|---|---|
| 2004/0000669 A1* | 1/2004 | Yamamura | 257/72 |
| 2004/0026695 A1 | 2/2004 | Francois | |
| 2004/0130033 A1 | 7/2004 | Masamitsu et al. | |
| 2005/0088551 A1* | 4/2005 | Lee et al. | 348/272 |
| 2006/0163451 A1* | 7/2006 | Park et al. | 250/208.1 |
| 2008/0029693 A1* | 2/2008 | Hirayama et al. | 250/226 |

FOREIGN PATENT DOCUMENTS

| | | |
|---|---|---|
| EP | 1 367 650 A1 | 12/2003 |
| JP | 10-154805 | 6/1998 |
| JP | 2001-237405 | 8/2001 |

OTHER PUBLICATIONS

PCT/US2009/0033121—PCT International Search Report and Written Opinion of the International Searching Authority, dated Mar. 30, 2009.
European Office Action mailed Mar. 23, 2011, European Application No. 09710695.9. (5 pages).
PCT/US/2009/0033121—International Preliminary Report on Patentability and Written Opinion of the International Searching Authority, issued Aug. 17, 2010 (6 pages).

* cited by examiner

*Primary Examiner* — Thao Le
*Assistant Examiner* — Matthew Gordon
(74) *Attorney, Agent, or Firm* — Blakely Sokoloff Taylor & Zafman LLP

(57) ABSTRACT

An image sensor includes at least one photosensitive element disposed in a semiconductor substrate. Metal conductors may be disposed on the semiconductor substrate. A filter may be disposed between at least two individual metal conductors and a micro-lens may be disposed on the filter. There may be insulator material disposed between the metal conductors and the semiconductor substrate and/or between individual metal conductors. The insulator material may be removed so that the filter may be disposed on the semiconductor substrate.

18 Claims, 5 Drawing Sheets

(not to scale)

(not to scale)

(not to scale)

(not to scale)

(not to scale)

SELF-ALIGNED FILTER FOR AN IMAGE SENSOR

BACKGROUND

1. Field

Embodiments of the present invention relate to image sensors and, in particular, to color filters for image sensors.

2. Discussion of Related Art

In general, conventional image sensors perform well to generate images. A typical image sensor may be fabricated using a complementary metal oxide semiconductor (CMOS) technology. Charge coupled device (CCD) technology is also suitable.

Conventional image sensors suffer from some limitations, however. When the image sensor has a relatively low sensitivity the image sensor does not collect enough light. The result is that the reproduced image can be too dark. Low sensitivity is particularly troublesome as devices are scaled smaller and smaller. One source of low sensitivity is in devices with smaller pixels; it can be difficult to get light into the smaller pixels.

Another limitation of image sensors concerns crosstalk. Crosstalk occurs when light designated for one pixel enters an adjacent pixel. For instance, light from a red pixel may be coupled into a green pixel or a blue pixel. Similarly, light designated for a white pixel may be coupled into a black pixel. The result is noise, which can cause a degraded reproduction of the image.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, wherein.

DETAILED DESCRIPTION OF EMBODIMENTS

Figure 1:
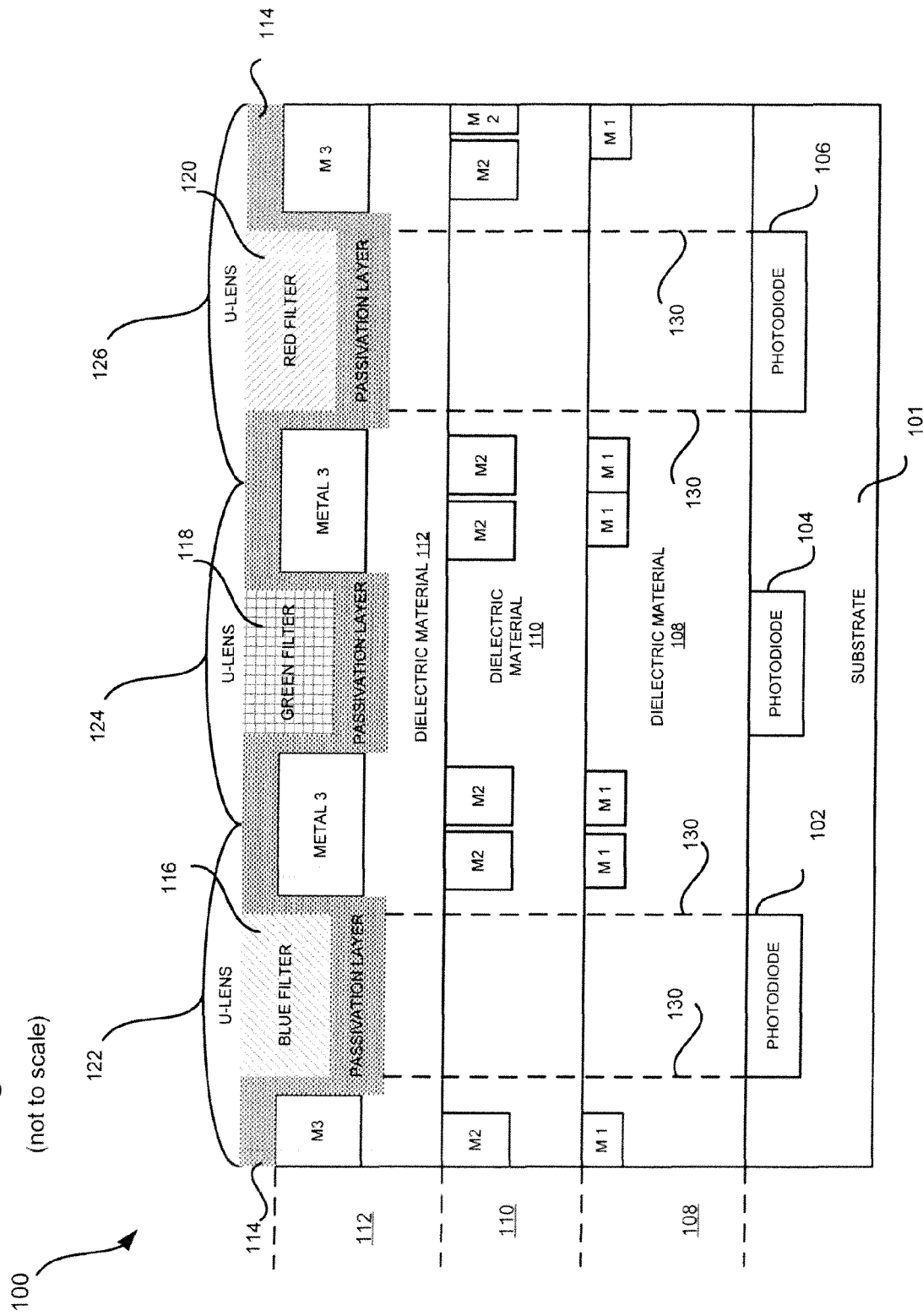
FIG. 1 is a side view illustrating self-aligned color filters arranged in a pattern over an array of photosensitive elements in an image sensor according to an embodiment of the present invention in which the filters are flush with the passivation layer.

In the below description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

According to some embodiments of the present invention, an image sensor may have at least one photosensitive element disposed in a semiconductor substrate. A plurality of metal conductors may be disposed on the semiconductor substrate. A filter may be disposed between at least two of the plurality metal conductors and a micro-lens may be disposed on the filter. There may be insulator material disposed between the plurality of metal conductors and the semiconductor substrate and/or between two of the plurality of metal conductors. The insulator material between the plurality of metal conductors may be removed so that the filter may be disposed between the plurality of metal conductors. The filter may extend substantially to the surface of the semiconductor substrate. There also may be a passivation layer between the plurality of metal conductors and the filter. The resulting pixel may have filter that is self-aligned over the photosensitive element during fabrication of the image sensor.

The image sensor may operate as follows. The micro-lens may focus light to the filter disposed between the plurality of metal conductors. The filter may substantially filter out light having wavelengths outside of its spectral range. The light from the filter may be detected by the photosensitive element, which may convert the light to an electrical signal.

For some embodiments, the filter may be a color filter, a black, a white filter, etc. The semiconductor substrate may be a silicon substrate. The insulator material may be silicon oxide. The passivation layer may be silicon nitride.

One advantage of embodiments of the present invention is that because the filters are self-aligned over the photosensitive element the crosstalk among pixels may be reduced. Another advantage of embodiments of the present invention is that because the filter is placed between the metal conductors rather than on the surface of the metal conductors or other layers making up the image sensor, a thicker filter may be used without increasing the overall height of the pixel stack. That is, the height of the layers of material making up the pixel can be increased without increasing the distance between the micro-lens and the substrate surface. Other features and advantages of the present invention will be apparent from the accompanying drawings and from the detailed description that follows.

FIG. 1 is a side view illustrating self-aligned filters arranged in a pattern over an array of photosensitive elements in an image sensor 100 according to an embodiment of the present invention. Generally, the image sensor 100 includes several photosensitive elements arranged in an array of two dimensional rows and columns in a substrate 101. In the illustrated embodiment, there are three photosensitive elements 102, 104, and 106, which are shown as photodiodes 102, 104, and 106. Of course, the array can include upwards of thousands of rows and/or columns, or more. Similarly, the array may have an arrangement other than columns and rows.

The substrate 101 may be a semiconductor substrate. For some embodiments, the substrate 101 is a doped silicon substrate.

Each photosensitive element 102, 104, and 106 typically converts light into an electric signal proportional to the intensity of light detected. The photosensitive element may be a photodiode or other solid state device. Other photosensitive elements also may be utilized as well. The resulting pixels may include amplification and readout circuitry such as one or more CMOS transistors (not shown), for example. The resulting pixels may be devices having size of approximately 1.75 microns or smaller. Alternatively, the resulting pixels may be larger. For purposes of clarity, only reference numbers for photosensitive elements 102, 104, and 106 are illustrated. The photosensitive elements 102, 104, and 106 may be disposed in the substrate 101 in any suitable known manner.

Typically, an individual pixel in the image sensor 100 may include a stack of multiple layers including metal layers, planarization layers, and the like. In the illustrated embodiment, the image sensor 100 includes a first metal layer having M1 metal conductors disposed in a dielectric material 108. The dielectric material 108 may be deposited and/or grown to fill the gaps between the M1 metal conductors and dielectric material 108 may be polished down to the M1 metal conductors. The dielectric material 108 may insulate the M1 metal conductors from the substrate 101.

The dielectric material 108 may be any insulator such as an oxide. For some embodiments, the dielectric material may be a silicon oxide.

The M1 metal conductors may be copper, aluminum, an aluminum-copper mixture, tungsten, or other metal suitable for carrying a signal.

In the illustrated embodiment, the image sensor 100 includes a second metal layer having M2 metal conductors disposed in a dielectric material 110. The dielectric material 110 may be deposited and/or grown to fill the gaps between the M2 metal conductors and the dielectric material 110 may be polished down to the M2 metal conductors. The dielectric material 110 may insulate the M1 metal conductors from the M2 metal conductors.

The dielectric material 110 may be any insulator such as an oxide or a nitride. For some embodiments, the dielectric material may be a silicon oxide, a silicon nitride, or other inorganic dielectric material. For other embodiments, organic dielectric material low k dielectrics, such as organic dielectrics, may be used.

The M2 metal conductors may be copper, aluminum, an aluminum-copper mixture, or other metal suitable for carrying a signal, such as tungsten.

In the illustrated embodiment, the image sensor 100 includes a third metal layer having M3 metal conductors disposed in a dielectric material 112. For some embodiments, the dielectric material 112 may be deposited and/or grown to fill the gaps between the M3 metal conductors and the dielectric material 110 may be polished down to the M3 metal conductors. The dielectric material 110 may insulate the M3 metal conductors from the M2 metal conductors.

The dielectric material 110 may be any insulator such as an oxide or a nitride. For some embodiments, the dielectric material may be a silicon oxide, silicon nitride, or other inorganic dielectric material. For other embodiments, organic dielectric material low k dielectrics, such as organic dielectrics, may be used.

The M3 metal conductors may be copper, aluminum, an aluminum-copper mixture, tungsten, or other metal suitable for carrying a signal.

For some embodiments, the dielectric material between the metal conductors may be removed and filters may be disposed between the metal conductors. In the illustrated embodiment, the dielectric material 112 between the M3 metal conductors is removed. A passivation layer 114 is disposed on the M3 metal conductors and the remaining dielectric material 112. Also in the illustrated embodiment, filters are disposed on the passivation layer 114 between the M3 metal conductors. The filters may be aligned with photosensitive elements such that a filter 116 is aligned with the photosensitive element 102, a filter 118 is aligned with the photosensitive element 104, and a filter 120 is aligned with the photosensitive element 106. The dotted lines 130 indicate the alignment of the filters with the photosensitive elements.

The passivation layer 114 may be a nitride, an oxide or other material suitable for protecting the M3 metal conductors. For some embodiments, the passivation layer may be a silicon nitride.

The filters 116, 118, and 120 may be arranged in any suitable pattern. In an embodiment in which the filters 116, 118, and 120 are color filters, the filters 116, 118, and 120 may be arranged in a Bayer pattern. In the illustrated embodiment, the filter 116 is a blue filter in that substantially allows blue light to pass but blocks substantially all other light in the visible spectrum, the filter 118 is a green filter in that substantially allows green light to pass but blocks substantially all other light in the visible spectrum, and the filter 120 is a red filter in that substantially allows red light to pass but blocks substantially all other light in the visible spectrum. For other embodiments, the filters may be cyan, magenta, yellow, or other suitable filters.

The filters 116, 118, and 120 may be made from any suitable material. One suitable material is an acrylic. Polymethylmethacrylate (PMMA) or polyglycidylmethacrylate (PGMA) that has been pigmented or dyed is suitable for embodiments in which the filters are color filters. Other photoresist-type materials that can be dyed or pigmented may also be used for embodiments in which the filters are color filters.

For some embodiments, the thickness of the passivation layer 114 may be increased making the area for the filters shallower and the filters may be thinner. Alternatively, the dielectric layer 112 may be etched deeper making the area for the filters deeper and the filters may be thicker.

For some embodiments, micro-lenses are disposed on the filters. In the illustrated embodiment, a micro-lens 122 is disposed on the filter 116, a micro-lens 124 is disposed on the filter 118, and a micro-lens 126 is disposed on the filter 120. The micro-lenses focus incident light onto the photosensitive elements such that the micro-lens 122 focuses incident light to the photosensitive element 102, the micro-lens 124 focuses incident light to the photosensitive element 104, and the micro-lens 126 focuses incident light to the photosensitive element 106. The micro-lenses as well as the filters, and passivation layer, may be disposed using any suitable deposition, etching, or masking technique, as well as planarization, heating, reflow, chemical vapor deposition (CVD), plasma enhanced chemical vapor deposition (PECVD), or other suitable technique, etc.

In conventional image sensors, the layers in the pixel stack are substantially flat and the filters are disposed on the flat portion. One advantage of having the filters disposed between the metal conductors is that the distance incident light has to travel to the photosensitive elements is less than the distance for conventional image sensors. With the portion of the dielectric material between metal conductors removed according to embodiments of the present invention, the filters are closer to the surface of the substrate and the distance light travels from the filters to the substrate is thus less.

In the illustrated embodiment, the filters are shown as being disposed between the M3 metal conductors on the third metal layer. However, according to embodiments of the filters may be disposed between the metal conductors on any metal layer, such as the metal layer closest to the substrate, for example. That is, according to embodiments of the present invention, the filters may be disposed between the M1 metal conductors on the first metal layer. Alternatively said, the first and second metal layers are optional and the image sensor may only have a single metal layer with one or more filters disposed between the metal conductors.

Figure 2:
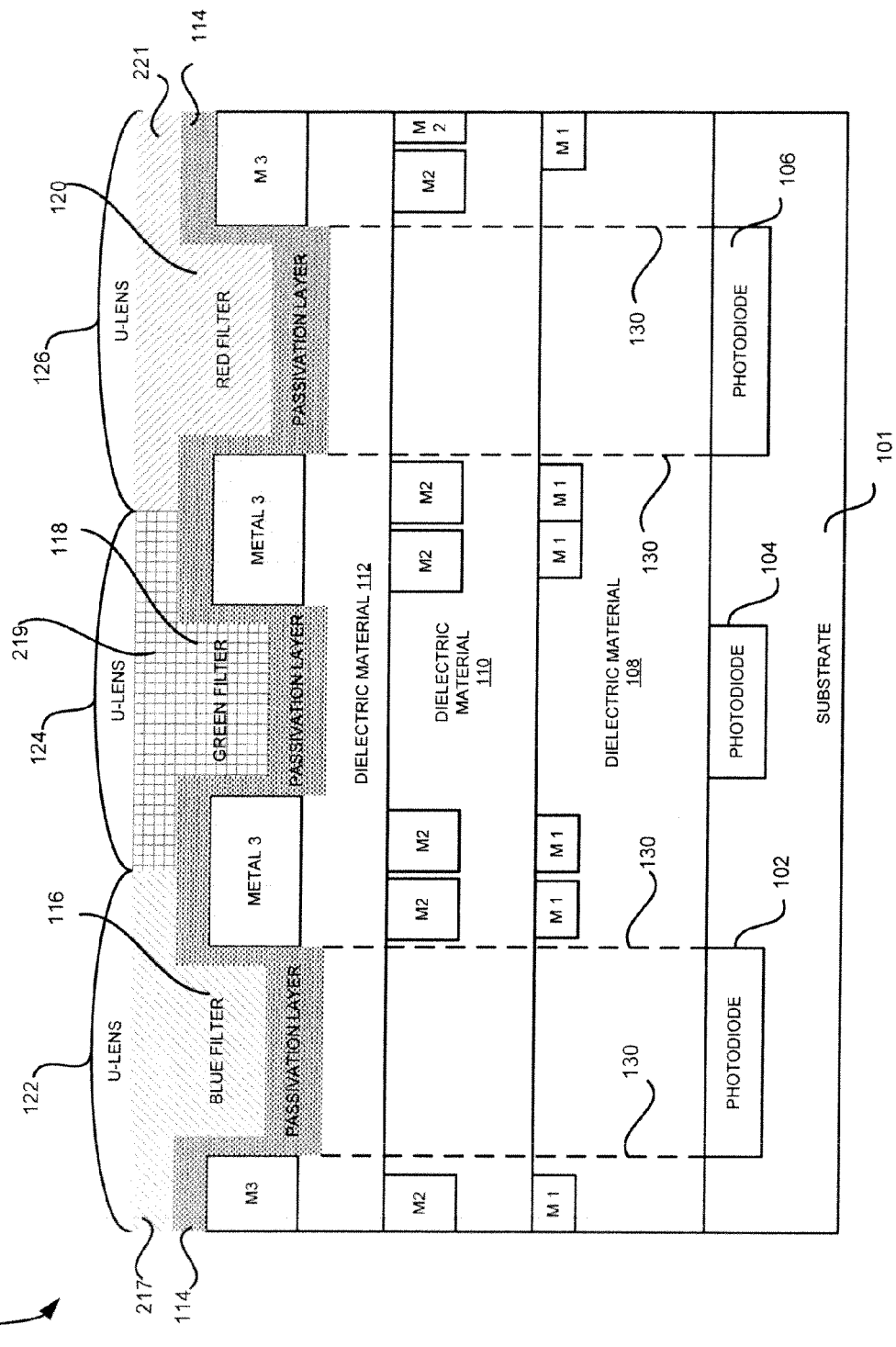
FIG. 2 is a side view illustrating self-aligned filters arranged in a pattern over an array of photosensitive elements in an image sensor according to an embodiment of the present invention in which the filters have ledges disposed on the passivation layer.

Note that in FIG. 1 the filters are flush with the surface of the passivation layer 114. FIG. 2 is a side view illustrating self-aligned filters arranged in a pattern over an array of photosensitive elements in an image sensor 200 according to an alternative embodiment of the present invention in which the filters have ledges disposed on the passivation layer 114. In the illustrated embodiment, the image sensor 200 includes the dielectric material 108, the substrate 101, the dielectric material 110, the dielectric material 112, the M1 metal conductors, the M2 metal conductors, the M3 metal conductors, and the passivation layer 114 as described above. Also as described above, the dielectric material 112 between the M3 metal conductors may be removed and the passivation layer 114 may be disposed on the M3 metal conductors and remaining dielectric material 112. Filters are disposed on the passivation layer 114 between the M3 metal conductors and aligned with photosensitive elements such that the filter 116 is aligned with the photosensitive element 102, the filter 118 is aligned with the photosensitive element 104, and the filter 120 is aligned with the photosensitive element 106.

In the embodiment illustrated in FIG. 2, the filter 116 has a ledge 217, the filter 118 has a ledge 219, and the filter 120 has a ledge 221. The ledges are disposed on the portion of the passivation layer 114 that is disposed on the M3 metal conductors.

For some embodiments, the filters may extend to any point in between the metal 3 layer and the surface of the substrate 101, such as to the metal 2 layer or to the metal 1 layer. Alternatively, the filters may extend as far as to the surface of the substrate 101.

Figure 3:
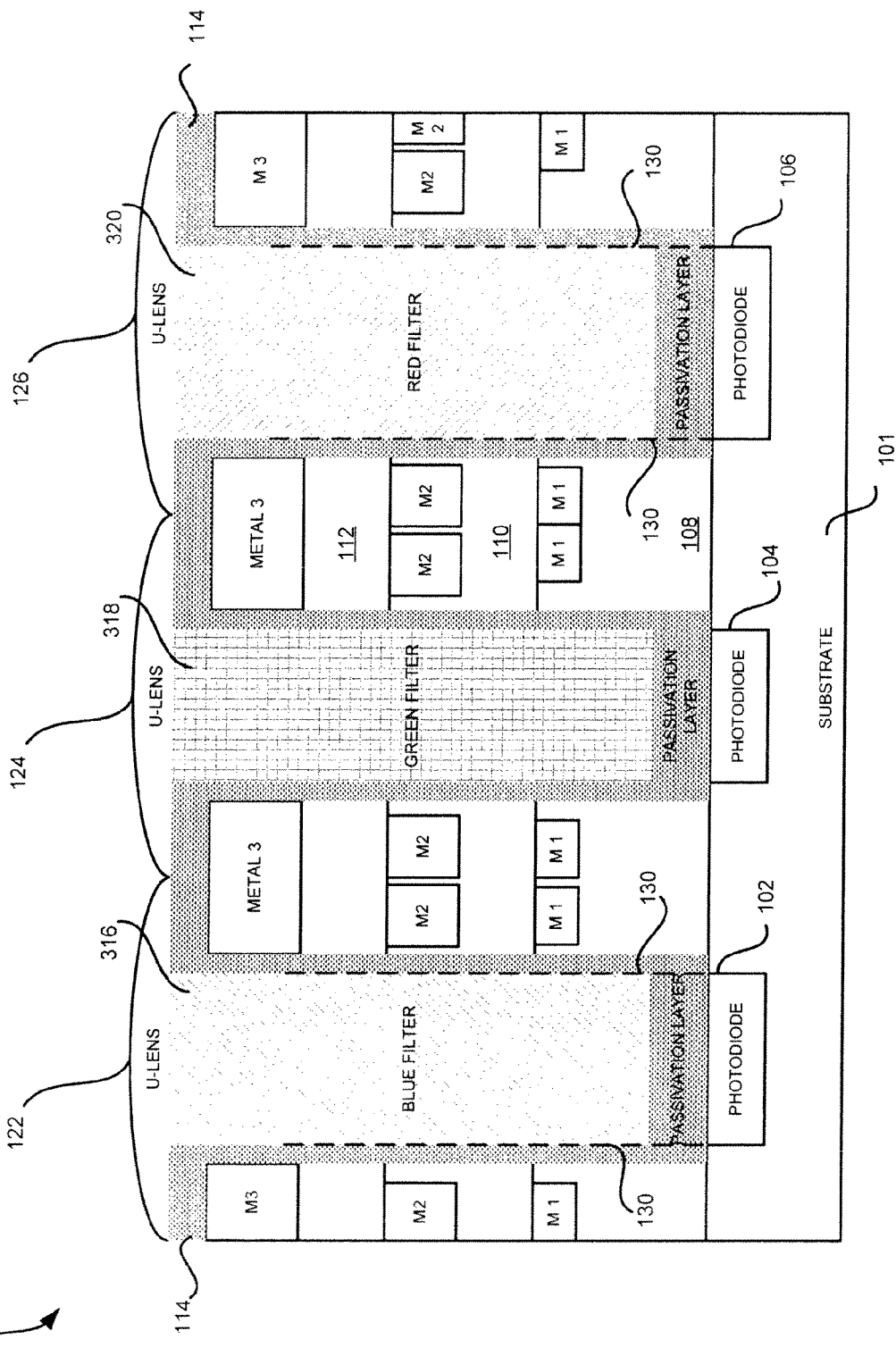
FIG. 3 is a side view illustrating self-aligned filters arranged in a pattern over an array of photosensitive elements in an image sensor according to an embodiment of the present invention in which the filters extend substantially to the semiconductor substrate and have ledges disposed on the passivation layer.

FIG. 3 is a side view illustrating self-aligned filters arranged in a pattern over an array of photosensitive elements in an image sensor 300 according to an embodiment of the present invention in which the filters extend substantially to the surface of the substrate 101. In the illustrated embodiment, the image sensor 300 includes the dielectric material 108, the substrate 101, the dielectric material 110, the dielectric material 112, the M1 metal conductors, the M2 metal conductors, the M3 metal conductors, and the passivation layer 114 as described above. Also as described above, the dielectric material 112 between the M3 metal conductors may be removed and the passivation layer 114 may be disposed on the M3 metal conductors and remaining dielectric material 112.

Filters are disposed on the passivation layer 114 between the M3 metal conductors and aligned with photosensitive elements such that a filter 316 is aligned with the photosensitive element 102, a filter 318 is aligned with the photosensitive element 104, and a filter 320 is aligned with the photosensitive element 106. In the embodiment illustrated in FIG. 3, the filters 316, 318, and 320 extend substantially to the surface of the semiconductor substrate 101.

For some embodiments, the filters that have ledges may extend to any point in between the metal 3 layer and the surface of the substrate 101, such as to the metal 2 layer or to the metal 1 layer. Alternatively, the filters may extend as far as to the surface of the substrate 101.

Figure 4:
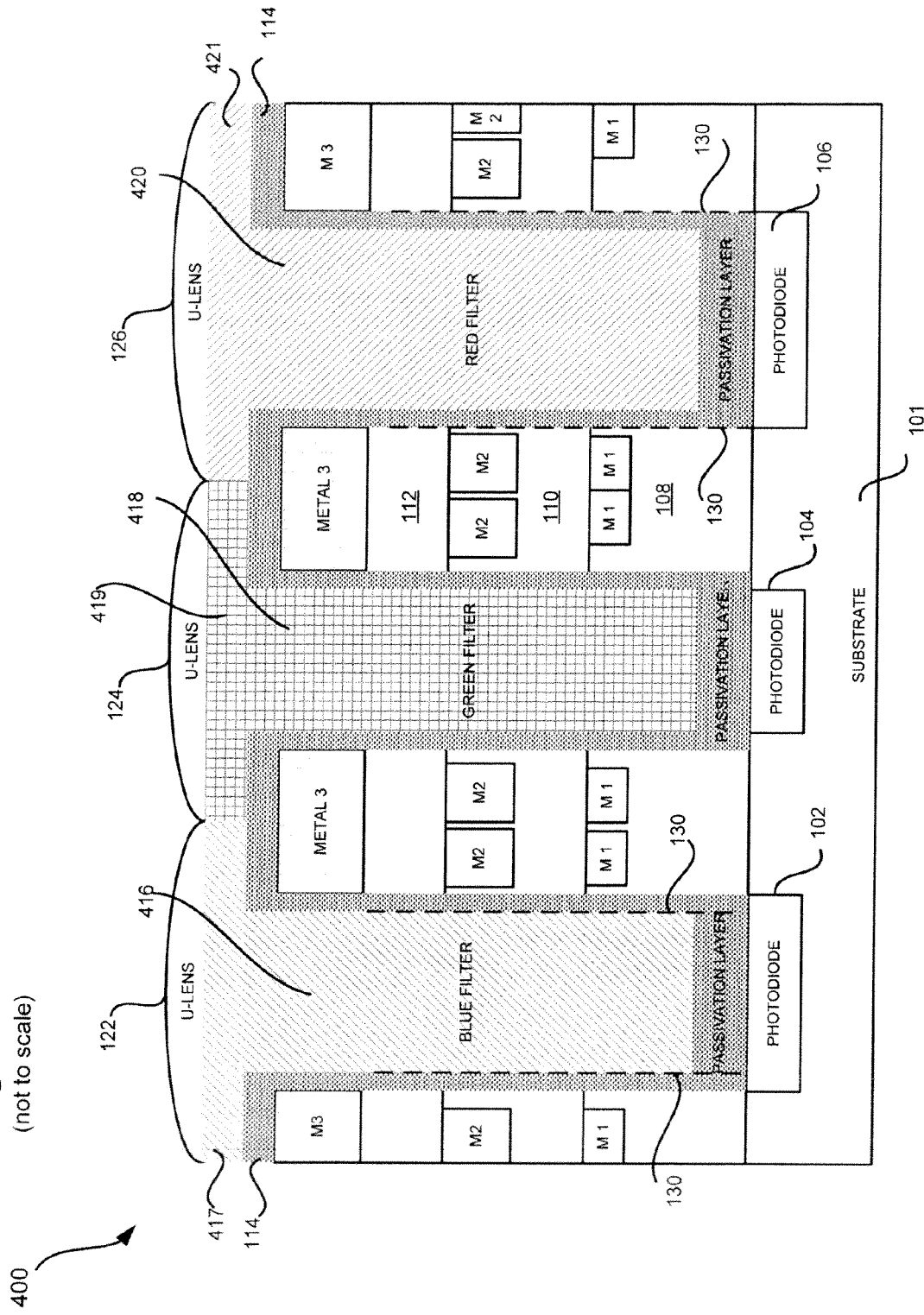
FIG. 4 is a side view illustrating self-aligned filters arranged in a pattern over an array of photosensitive elements in an image sensor according to an embodiment of the present invention in which the filters are flush with the passivation layer and extend substantially to the substrate.

FIG. 4 is a side view illustrating self-aligned filters arranged in a pattern over an array of photosensitive elements in an image sensor 400 according to an embodiment of the present invention in which the filters have ledges and the filters extend substantially to the surface of the substrate 101. In the illustrated embodiment, the image sensor 400 includes the dielectric material 108, the substrate 101, the dielectric material 110, the dielectric material 112, the M1 metal conductors, the M2 metal conductors, the M3 metal conductors, and the passivation layer 114 as described above. Also as described above, the dielectric material 112 between the M3 metal conductors may be removed and the passivation layer 114 may be disposed on the M3 metal conductors and remaining dielectric material 112.

Filters are disposed on the passivation layer 114 between the M3 metal conductors and aligned with photosensitive elements such that a filter 416 with a ledge 417 is aligned with the photosensitive element 102, a filter 418 with a ledge 419 is aligned with the photosensitive element 104, and a filter 420 with a ledge 421 is aligned with the photosensitive element 106. In the embodiment illustrated in FIG. 3, the filters 416, 418, and 420 extend substantially to the surface of the semiconductor substrate 101.

Figure 5:
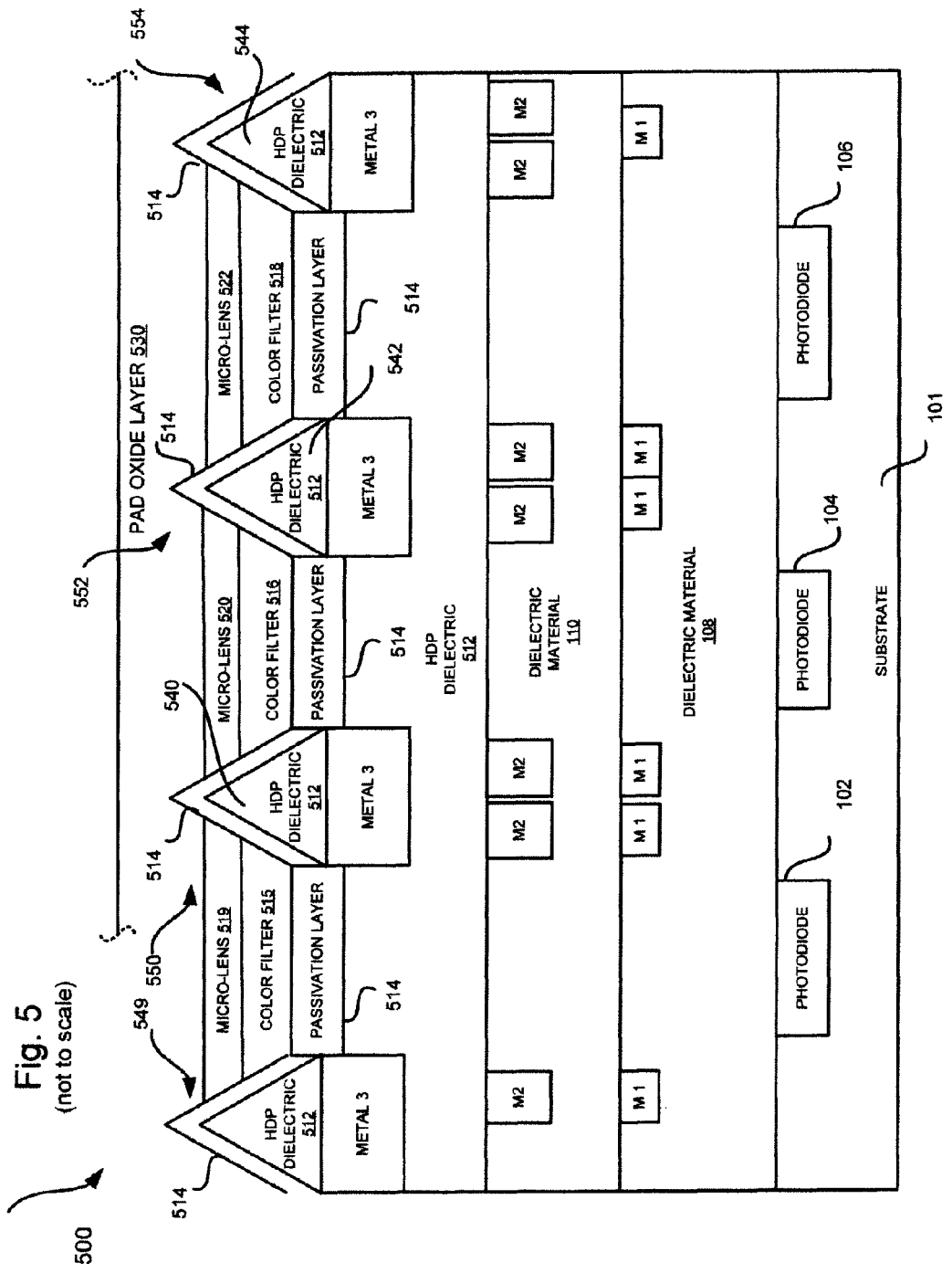
FIG. 5 is a side view illustrating self-aligned filters arranged in a pattern over an array of photosensitive elements in an image sensor according to an alternative embodiment of the present invention in which the filters are disposed in a gap between peaks disposed on metal conductors.

FIG. 5 is a side view illustrating self-aligned color filters arranged in a pattern over an array of photosensitive elements in an image sensor 500 according to an alternative embodiment of the present invention in which the filters are disposed in a gap between the M3 metal conductors above the third metal layer. In the illustrated embodiment, the dielectric material 108 is disposed on the substrate 101, the dielectric material 110 is disposed on the dielectric material 108, and the dielectric material 112 disposed on the dielectric material 110. Also in the illustrated embodiment, the M1 metal conductors are disposed in the dielectric material 108 and the 2 metal conductors are disposed in the dielectric material 110.

In the illustrated embodiment, a dielectric material 512 is disposed on the M3 metal conductors and on the dielectric layer 110. For some embodiments, the dielectric material 512 may be disposed on the M3 metal conductors using high-density plasma (HDP) chemical vapor deposition (CVD) of silicon oxide ($SiO_2$). The high-density plasma (HDP) chemical vapor deposition (CVD) may use silane ($SiH_4$) gas and oxygen gas as reactants, with an argon sputter. Deposition and sputter etching may happen simultaneously. The resulting cross section of dielectric material 512 on the M3 metal conductors may be a triangular or trapezoidal shape 540, 542, and 544, and the dielectric material 512 deposited between the M3 metal conductors may be substantially flat or planar. The deposition thickness or deposition/sputtering ratio will determine the profile of the dielectric material 512. In the illustrated embodiment, there is a slight recess in the dielectric material 512 between the M3 metal conductors. More sputtering may be used in order to achieve the recessed portion of dielectric material 512 between the M3 metal conductors.

In the illustrated embodiment, a passivation layer 514 is disposed on the triangles/trapezoids 540, 542, and 544 of the dielectric material 512. The passivation layer also is disposed on the planar portion of the dielectric material 512 in between the M3 metal conductors. The passivation layer 514 may be silicon nitride (Si$_2$N$_3$) or other material suitable for passivation.

In the illustrated embodiment, a filter 516 and a micro-lens 520 are disposed between a peak 550 made up of the triangle/trapezoid 540 of the dielectric material 512 and the passivation layer 514 and a peak 552 made up of the triangle/trapezoid 542 of the dielectric material 512 and the passivation layer 514. The filter 516 (and the micro-lens 520) is self-aligned over the photosensitive element 104. For some embodiments, the shape of the filter 516 serves to bend incident light more towards the photosensitive element 104. Further, the passivation layer 514 may have an index of refraction that is higher than the index of refraction of the filter 516. The refractive index difference also may aid in bending light further towards the photosensitive element 104. The micro-lens 522 may focus incident light into the filter 516 and down to the photosensitive element 104.

In the illustrated embodiment, a filter 518 and a micro-lens 522 are disposed between a peak 552 made up of the triangle/trapezoid 542 of the dielectric material 512 and the passivation layer 514 and a peak 554 made up of the triangle/trapezoid 544 of the dielectric material 512 and the passivation layer 514. The filter 518 (and the micro-lens 522) is self-aligned over the photosensitive element 106. For some embodiments, the shape of the filter 518 serves to bend incident light more towards the photosensitive element 106. Further, the passivation layer 514 may have an index of refraction that is higher than the index of refraction of the filter 518. The refractive index difference also may aid in bending light further towards the photosensitive element 106. The micro-lens 522 may focus incident light into the filter 518 and down to the photosensitive element 106.

Of course, the image sensor 500 may have other peaks, such as the peak 549. A filter 515 and a micro-lens 519 may be disposed between the peak 549 and the peak 550.

For some embodiments, the image sensor 500 may have a pad oxide material 530 disposed on the micro-lenses between the peaks. Chemical mechanical planarization (CMP) techniques may be used to planarize the image sensor 500 surface.

One advantage of having the filters disposed between the peaks and aligned over their respective photosensitive elements and is that the funnel gap created by the peaks may make a larger opening for incident light. This may result in improved light collection and sensitivity for the image sensor 500.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the method and processes herein. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.).

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An image sensor, comprising:
a semiconductor substrate having at least one photosensitive element disposed therein;
a plurality of metal conductors disposed on the semiconductor substrate;
a color filter disposed between at least two of the plurality of metal conductors, such that a portion of the color filter extends below an uppermost surface of at least one of the plurality of metal conductors; and
a passivation layer disposed on the plurality of metal conductors, wherein the color filter includes a ledge directly disposed on the passivation layer, wherein no portion of a top or bottom surface of the ledge contacts a top or bottom surface of a ledge of an adjacent color filter of the image sensor, and wherein a thickness of the color filter at the ledge is less than a thickness of the color filter directly above the photosensitive element.

2. The image sensor of claim 1, further comprising a micro-lens disposed on the color filter.

3. The image sensor of claim 1, wherein the color filter extends to a surface of the photosensitive element.

4. The image sensor of claim 1, wherein the passivation layer is disposed between the plurality of metal conductors and the color filter.

5. The image sensor of claim 4, wherein the passivation layer comprises silicon nitride.

6. The image sensor of claim 1, wherein the semiconductor substrate is a silicon substrate.

7. The image sensor of claim 1, further comprising a first insulator disposed between the plurality of metal conductors and the semiconductor substrate.

8. The image sensor of claim 7, further comprising:
a second insulator disposed between the first insulator and the semiconductor substrate; and
a second plurality of metal conductors disposed in the second insulator.

9. The image sensor of claim 8, further comprising:
a third insulator disposed between the second insulator and the semiconductor substrate; and
a third plurality of metal conductors disposed in the third insulator.

10. The image sensor of claim 1, wherein the passivation layer is a single layer.

11. The image sensor of claim 1, wherein the color filter directly intervenes between the at least two of the plurality of metal conductors.

12. An image sensor comprising:
a semiconductor substrate having a front surface and a back surface and at least one photosensitive element disposed therein;
a metal stack having a top surface and a bottom surface, the bottom surface of the metal stack being disposed on the front surface of the substrate, the metal stack comprising a plurality of individual layers, each individual layer including a dielectric and a plurality of metal conductors;
a trench formed in the metal stack between at least two of the plurality of metal conductors, the trench having a pair of sidewalls and a bottom and extending partially or fully through the metal stack from the top surface toward the bottom surface;

a passivation layer formed on the top surface of the metal stack, the sidewalls of the trench, and bottom of the trench; and a color filter including:
- a main part that fills the portion of the trench not already filled by the passivation layer such that the passivation layer on the sidewalls of the trench is sandwiched between the color filter and the metal stack and the passivation layer on the bottom of the trench is sandwiched between the color filter and the substrate, and
- a ledge integrated with and projecting laterally from the main part, wherein the ledge is disposed on the passivation layer on the top surface of the metal stack such that the passivation layer is sandwiched between the ledge and the metal stack, and wherein no portion of a top or bottom surface of the ledge contacts a top or bottom surface of a ledge of an adjacent color filter of the image sensor.

13. The image sensor of claim 12, further comprising a micro-lens disposed on the color filter.

14. The image sensor of claim 12 wherein the trench extends from the top surface of the metal stack to the bottom surface of the metal stack.

15. The image sensor of claim 12 wherein the passivation layer comprises silicon nitride.

16. The image sensor of claim 12 wherein the semiconductor substrate is a silicon substrate.

17. The image sensor of claim 12 wherein the passivation layer is a single layer.

18. The image sensor of claim 12 wherein the ledge abuts, but does not overlap, the ledge of an adjacent color filter.

\* \* \* \* \*